US012620818B2

(12) United States Patent
Gong

(10) Patent No.: US 12,620,818 B2
(45) Date of Patent: May 5, 2026

(54) CHARGING AND DISCHARGING METHOD FOR SERIES-PARALLEL BATTERIES AND SERIES-PARALLEL BATTERY SYSTEM

(71) Applicant: ZTE CORPORATION, Shenzhen (CN)

(72) Inventor: Yong Gong, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 821 days.

(21) Appl. No.: 17/925,868

(22) PCT Filed: May 20, 2021

(86) PCT No.: PCT/CN2021/094921
§ 371 (c)(1),
(2) Date: Nov. 17, 2022

(87) PCT Pub. No.: WO2021/249150
PCT Pub. Date: Dec. 16, 2021

(65) Prior Publication Data
US 2023/0198271 A1 Jun. 22, 2023

(30) Foreign Application Priority Data
Jun. 9, 2020 (CN) .......................... 202010518584.7

(51) Int. Cl.
*G01R 31/396* (2019.01)
*G01R 31/3835* (2019.01)
(Continued)

(52) U.S. Cl.
CPC .......... *H02J 7/575* (2026.01); *G01R 31/3835* (2019.01); *G01R 31/396* (2019.01);
(Continued)

(58) Field of Classification Search
CPC ...... H02J 7/0024; H02J 7/0018; H02J 7/0029; H02J 7/007; H02J 2310/22; H02J 7/0014;
(Continued)

(56) References Cited

U.S. PATENT DOCUMENTS

| | | | |
|---|---|---|---|
| 2011/0001456 A1 | 1/2011 | Wang | |
| 2012/0306507 A1* | 12/2012 | Fujimatsu | ............ G01R 31/396 |
| | | | 324/434 |
| 2023/0268763 A1* | 8/2023 | Li | ........................... H02J 7/342 |
| | | | 320/116 |

FOREIGN PATENT DOCUMENTS

| | | |
|---|---|---|
| CN | 101277021 A | 10/2008 |
| CN | 101312252 A | 11/2008 |

(Continued)

OTHER PUBLICATIONS

China Patent Office, the first Office action of CN application 202010518584.7 issued on Sep. 9, 2025.

(Continued)

*Primary Examiner* — Julian D Huffman
*Assistant Examiner* — Aiman Bickiya
(74) *Attorney, Agent, or Firm* — & Cai Intellectual Property (USA) Office

(57) ABSTRACT

The present disclosure provides a charging and discharging method for series-parallel batteries applied to a series-parallel battery system including series-parallel batteries and a mainboard, the series-parallel batteries are connected to the mainboard and include at least two batteries that are connected to each other, and the method includes: determining and adjusting a connection mode of each battery of the series-parallel batteries according to a charging or discharging demand type; and charging or discharging the series-parallel batteries according to the connection mode of each (Continued)

battery of the series-parallel batteries. The present disclosure further provides a series-parallel battery system.

20 Claims, 7 Drawing Sheets

(51) Int. Cl.

| | | |
|---|---|---|
| *H01M 10/44* | (2006.01) |
| *H01M 10/46* | (2006.01) |
| *H01M 10/48* | (2006.01) |
| *H01M 50/509* | (2021.01) |
| *H02J 7/50* | (2026.01) |
| *H02J 7/56* | (2026.01) |
| *H02J 7/60* | (2026.01) |
| *H02J 7/90* | (2026.01) |
| *H01M 10/42* | (2006.01) |

(52) U.S. Cl.

CPC ......... *H01M 10/441* (2013.01); *H01M 10/46* (2013.01); *H01M 10/482* (2013.01); *H01M 50/509* (2021.01); *H02J 7/56* (2026.01); *H02J 7/60* (2026.01); *H02J 7/90* (2026.01); *H01M 2010/4271* (2013.01)

(58) Field of Classification Search

CPC .. H02J 7/0031; H02J 7/0047; G01R 31/3835; G01R 31/396; H01M 10/441; H01M 10/46; H01M 10/482; H01M 50/509; H01M 2010/4271; H01M 10/425; Y02B 40/00; Y02E 60/10

USPC .......................................................... 320/117

See application file for complete search history.

(56) References Cited

FOREIGN PATENT DOCUMENTS

| CN | 102593888 | A | 7/2012 |
|---|---|---|---|
| CN | 203519738 | U | 4/2014 |
| CN | 104953558 | A | 9/2015 |
| CN | 106374559 | A | 2/2017 |
| CN | 106786998 | A | 5/2017 |
| CN | 206226035 | U | 6/2017 |
| CN | 107221995 | A | 9/2017 |
| CN | 107546798 | A | 1/2018 |
| CN | 109980713 | A | 7/2019 |
| CN | 110400982 | A | 11/2019 |
| CN | 209748220 | U | 12/2019 |
| CN | 212726500 | U | 3/2021 |
| GB | 2578828 | A | 5/2020 |
| JP | 06253463 | A | 9/1994 |
| JP | 10302846 | A | 11/1998 |
| JP | 2014063567 | A | 4/2014 |

OTHER PUBLICATIONS

European Patent Office, The extended European search report issued Jun. 7, 2024 for application No. EP21822508.4.

WIPO, International Search Report issued on Jul. 7, 2021.

Japan Patent Office, First Office Action issued Oct. 10, 2023 for application No. JP2022-566723.

* cited by examiner

CHARGING AND DISCHARGING METHOD FOR SERIES-PARALLEL BATTERIES AND SERIES-PARALLEL BATTERY SYSTEM

CROSS-REFERENCE TO RELATED APPLICATIONS

The present disclosure claims the priority to the Chinese Patent Application No. 202010518584.7 filed with the CNIPA on Jun. 9, 2020, the entire contents of which are incorporated herein by reference.

TECHNICAL FIELD

The present disclosure relates to, but is not limited to, the field of battery technology.

BACKGROUND

Terminals such as mobile phones have become important tools in various aspects of the life such as communication interaction and digital entertainment, and a high-capacity battery is a main measure for improving the battery life of the terminals. The high-capacity battery and the frequent use of the terminals make fast charging become an important aspect in the improvement in user experience. Due to a transmission current limit of 5 A (amperes) of cables, in order to increase charging efficiency and reduce a power transmission loss and a power conversion loss, high voltage charging has become a mainstream option. The transmission method of increasing a voltage and reducing a current can effectively reduce a line transmission loss, but cannot be directly used to charge a battery because the high voltage is not matched with a voltage of the battery. Even in a case where a 5V (volts) power supply is used for charging, the voltage of the 5V power supply needs to be converted to a voltage suitable for the battery with a power conversion chip for charging.

SUMMARY

In one aspect, the present disclosure provides a charging and discharging method for series-parallel batteries applied to a series-parallel battery system including series-parallel batteries and a mainboard, the series-parallel batteries are connected to the mainboard and include at least two batteries that are connected to each other, and the method includes: determining and adjusting a connection mode of each battery of the series-parallel batteries according to a charging or discharging demand type; and charging or discharging the series-parallel batteries according to the connection mode of each battery of the series-parallel batteries.

In the other aspect, the present disclosure further provides a series-parallel battery system, including series-parallel batteries and a mainboard, which are connected to each other, the mainboard includes a charging and discharging management circuit, the series-parallel batteries include a battery combination management circuit, and at least two batteries that are connected to each other, the charging and discharging management circuit is connected to the battery combination management circuit and is configured to determine a charging or discharging demand type, and send a corresponding adjustment instruction to the battery combination management circuit according to the charging or discharging demand type; and the battery combination management circuit is configured to adjust a connection mode of the batteries according to the adjustment instruction, and perform charging or discharging according to the connection mode of the batteries.

BRIEF DESCRIPTION OF DRAWINGS

FIG. 2b is a schematic structural diagram of series-parallel batteries in the series-parallel battery system shown in FIG. 2a;

FIG. 3b is a schematic structural diagram of series-parallel batteries in the series-parallel battery system shown in FIG. 3a;

DETAIL DESCRIPTION OF EMBODIMENTS

Figure 1:
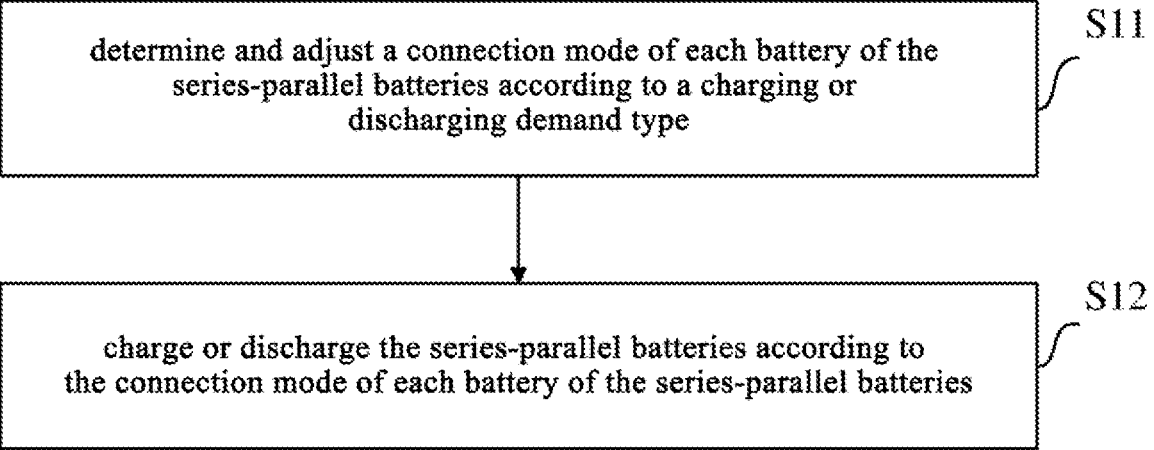
FIG. 1 is a flowchart illustrating a charging and discharging method for series-parallel batteries according to the present disclosure.

Exemplary embodiments will be described more fully below with reference to the drawings, but the exemplary embodiments may be embodied in different forms, and should not be interpreted as being limited to the embodiments described herein. Rather, the embodiments are provided to make the present disclosure thorough and complete, and are intended to enable those of ordinary skill in the art to fully understand the scope of the present disclosure.

The term "and/or" used herein includes any and all combinations of one or more associated listed items.

The terms used herein are merely used to describe specific embodiments, and are not intended to limit the present disclosure. As used herein, "a" and "the" which indicate a singular form are intended to include a plural form, unless expressly stated in the context. It should be further understood that the term(s) "include" and/or "be made of" used herein indicate(s) the presence of the described features, integers, operations, elements and/or components, but do not exclude the presence or addition of one or more other features, integers, operations, elements, components and/or combinations thereof.

The embodiments described herein can be described with reference to plans and/or cross-sectional views with the aid of idealized schematic diagrams of the present disclosure. Accordingly, the exemplary drawings may be modified according to manufacturing techniques and/or tolerances. Therefore, the embodiments are not limited to those illustrated by the drawings, but include modifications to configuration formed based on a manufacturing process. Thus, regions shown in the drawings are illustrative, and shapes of the regions shown in the drawings illustrate specific shapes of regions of elements, but are not intended to make limitations.

Unless otherwise defined, all terms (including technical and scientific terms) used herein have the same meaning as commonly understood by those of ordinary skill in the art. It should be further understood that terms, such as those defined in commonly used dictionaries, should be interpreted as having a meaning that is consistent with a meaning in the context of the related technology and the background of the present disclosure, and should not be interpreted in an idealized or overly formal sense unless expressly so defined herein.

At present, a solution to adaptation of a high voltage to a voltage of a battery is to connect batteries in series. By connecting the batteries in series to adapt to the input of the high voltage, a power loss caused by the power conversion can be reduced, but there are still the following disadvantages: (1) since a circuit system merely supports the power supply for a single battery, the series-connected batteries needs to be converted to an adaptive power supply by a power supply chip for output, which also results in a loss to certain extent; (2) when the conventional 5V charging method is applied to the charging of the series-connected batteries, a booster circuit needs to be added to adapt to the charging of the series-connected batteries, and the boosting conversion efficiency is also low; and (3) fixedly connecting the batteries in series can reduce a charging loss, but also leads to a discharging loss, and the discharging loss may also obviously reduce the battery life as the overall system power is increased with the popularization of the fifth generation mobile communication technology (5G) and the like.

Therefore, the present disclosure provides a charging and discharging method for series-parallel batteries and a series-parallel battery system, which substantially avoid one or more of the problems caused by the disadvantages and the limitations of the related technology.

Figure 8:
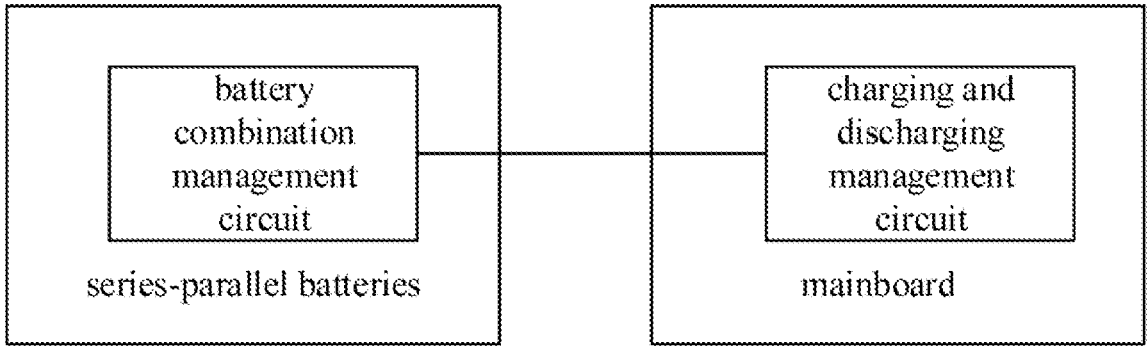
FIG. 8 is a schematic structural diagram of a series-parallel battery system according to the present disclosure.

The present disclosure provides a charging and discharging method for series-parallel batteries, which is applied to a series-parallel battery system shown in FIG. 8. As shown in FIG. 8, the series-parallel battery system includes series-parallel batteries and a mainboard, and the series-parallel batteries are connected to the mainboard, and include at least two batteries (not shown) that are connected to each other.

The charging and discharging method for series-parallel batteries provided by the present disclosure is used for charging and discharging the series-parallel batteries, and the charging and discharging method for series-parallel batteries is described in detail below with reference to FIG. 8 and FIG. 1.

With reference to FIG. 1 and FIG. 8, the charging and discharging method for series-parallel batteries provided by the present disclosure may include the following operations S11 and S12.

In operation S11, a connection mode of each battery of the series-parallel batteries is determined and adjusted according to a charging or discharging demand type.

In some implementations, the charging demand type may include: parallel charging and series charging. The discharging demand type may include: parallel output discharging, multi-path independent output discharging and series output discharging.

In this operation, a charging and discharging management circuit of the mainboard determines the connection mode of each battery of the series-parallel batteries according to the charging or discharging demand type, and instructs a battery combination management circuit of the series-parallel batteries to adjust the connection mode of each battery.

In operation S12, the series-parallel batteries are charged or discharged according to the connection mode of each battery of the series-parallel batteries.

In this operation, the battery combination management circuit of the series-parallel batteries adjusts the connection mode of each battery according to an instruction from the charging and discharging management circuit, and controls the charging or discharging of the series-parallel batteries in the adjusted connection mode. For example, if parallel charging is desired to be performed on the series-parallel batteries, each battery of the series-parallel batteries is adjusted to be in a parallel connection mode, and the series-parallel batteries are charged in the parallel connection mode.

The charging and discharging method for series-parallel batteries provided by the present disclosure is applied to the series-parallel battery system including the series-parallel batteries and the mainboard, the series-parallel batteries are connected to the mainboard and include at least two batteries that are connected to each other, and the method includes: determining and adjusting the connection mode of each battery of the series-parallel batteries according to the charging or discharging demand type; and charging or discharging the series-parallel batteries according to the connection mode of each battery of the series-parallel batteries. According to the present disclosure, cells in all the batteries of the series-parallel batteries may adopt a series connection mode or a parallel connection mode according to the charging and discharging demand, which may, as compared with the existing single-battery power supply system, convert a voltage of the series-connected batteries to a voltage of a single battery without the power supply chip and thus effectively increase the discharging efficiency, and may also, as compared with the existing fixed series charging method, obviate the need to add a booster circuit for adapting to the charging of the series-connected batteries and thus effectively increase the charging efficiency.

An existing solution of series charging and parallel discharging is to dispose four switch combinations between two series-connected batteries to meet different charging and discharging demands. However, the solution has the following disadvantages: (1) during both a charging stage and a discharging stage, two switches are operating in the circuit, which may increase impedance losses of the switches. For example, for 65 W (watt) charging, a current entering the batteries is greater than 5 A, and an impedance loss of 10 milliohm of the switch may result in a conduction loss greater than 0.25 W of the switch; and (2) a plurality of electronic switches may occupy a large circuit area when disposed in the circuit, and disposing the plurality of electronic switches in a circuit of a mobile terminal is especially difficult to implement.

In order to solve the above problems, the present disclosure provides a series-parallel battery system, which includes a switch configured to adjust the connection mode of each battery of series-parallel batteries, and the switch may be disposed inside the series-parallel batteries or on a mainboard. The series-parallel batteries at least include: a battery combination management circuit, a first cell, a second cell, a first protection circuit, a second protection circuit and a third protection circuit, the first cell, the first protection circuit and the second protection circuit belong to a same battery (e.g., a first battery), and the second cell and the third protection circuit belong to a same battery (e.g., a second battery).

In one battery, the cell stores electric energy, and the protection circuit detects voltages and currents at two ends of the cell so as to perform overcharge protection and over-discharge protection on the cell. The first protection circuit or the second protection circuit cooperates with the first cell to complete charging and discharging of the first battery. The second cell cooperates with the third protection circuit to complete charging and discharging of the second battery. The battery combination management circuit controls the switch and each protection circuit to be turned on or turned off according to a charging or discharging demand determined by a charging and discharging management circuit, so as to realize series combination or parallel combination of the batteries, or the charging and discharging management circuit controls on or off of the switch so as to realize the series combination or the parallel combination of the batteries.

According to the present disclosure, the number of the switches is reduced, and switching between the battery connection modes in a charging state and switching between the battery connection modes in a discharging state can be realized using merely one switch, so that an impedance loss on a charging or discharging loop can be reduced, thereby further increasing the charging efficiency and the discharging efficiency; moreover, the circuit layout can be optimized, which facilitates lightening and thinning of terminal devices and reduces cost.

The solution where the switch is disposed inside the series-parallel batteries and the solution where the switch is disposed on the mainboard are described in detail below with reference to FIGS. 2a and 2b and FIGS. 3a and 3b, respectively.

Figure 2A:
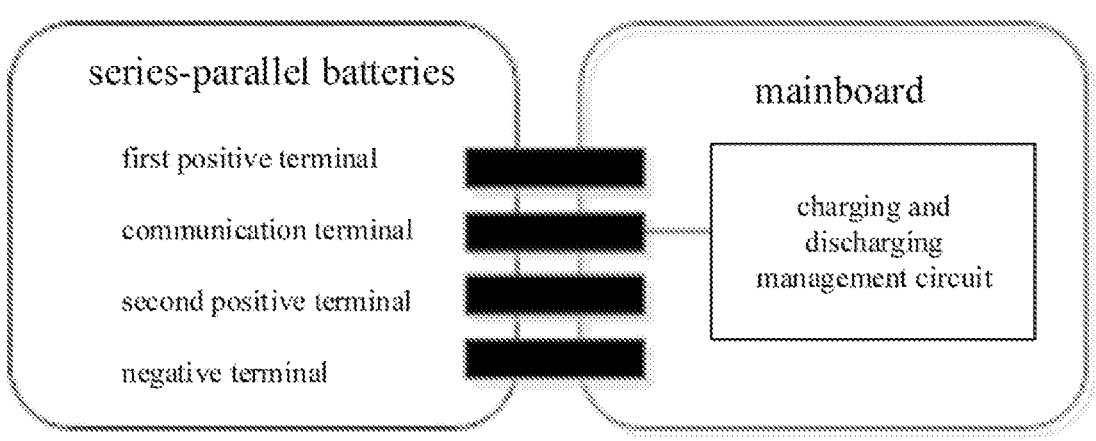
FIG. 2a is a schematic structural diagram of a series-parallel battery system according to the present disclosure.
Figure 2B:
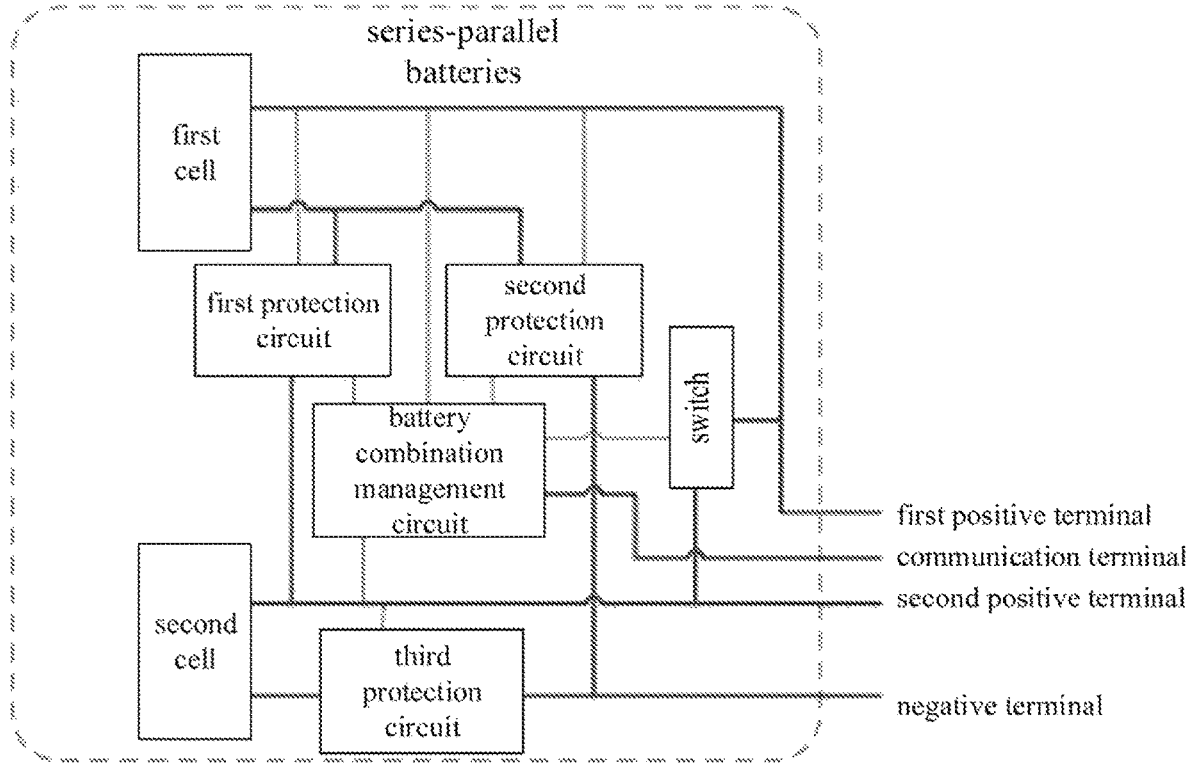

In some implementations, as shown in FIG. 2a and FIG. 2b, the switch is disposed inside the series-parallel batteries, a first end of the switch is connected to a first end of the first cell and a first positive terminal of the series-parallel batteries, a second end of the switch is connected to a first end of the second cell and a second positive terminal of the series-parallel batteries, and a third end of the switch is connected to a fourth end of the battery combination management circuit. The switch is configured to connect the first positive terminal to the second positive terminal, the first positive terminal and the second positive terminal are used for charging or discharging, and the second positive terminal is configured to provide a single-battery supply voltage for the mainboard by default. The first end of the first cell is respectively connected to the first positive terminal of the series-parallel batteries, a third end of the first protection circuit, a third end of the second protection circuit and a third end of the battery combination management circuit, and a second end of the first cell is respectively connected to a first end of the first protection circuit and a first end of the second protection circuit. The first end of the second cell is respectively connected to a second end of the first protection circuit, a third end of the third protection circuit, the second positive terminal of the series-parallel batteries and a fifth end of the battery combination management circuit, and a second end of the second cell is connected to a first end of the third protection circuit. A first end of the battery combination management circuit is connected to a fourth end of the first protection circuit, a second end of the battery combination management circuit is connected to a fourth end of the second protection circuit, and a sixth end of the battery combination management circuit is connected to a communication terminal of the series-parallel batteries. A second end of the third protection circuit is respectively connected to a second end of the second protection circuit and a negative terminal of the series-parallel batteries.

The mainboard includes the charging and discharging management circuit connected to the communication terminal of the series-parallel batteries.

The series-parallel batteries are connected to the mainboard through the first positive terminal, the second positive terminal, the communication terminal and the negative terminal. The first positive terminal and the negative terminal are configured to charge or discharge the batteries, the second positive terminal and the negative terminal are configured to provide a single-battery voltage for discharging, and the communication terminal is used for communication between the battery combination management circuit and the charging and discharging management circuit of the mainboard. The switch is configured to connect the first positive terminal to the second positive terminal, the first positive terminal and the second positive terminal are used for charging or discharging, and the second positive terminal is configured to provide the single-battery supply voltage for the mainboard by default.

Figure 3A:
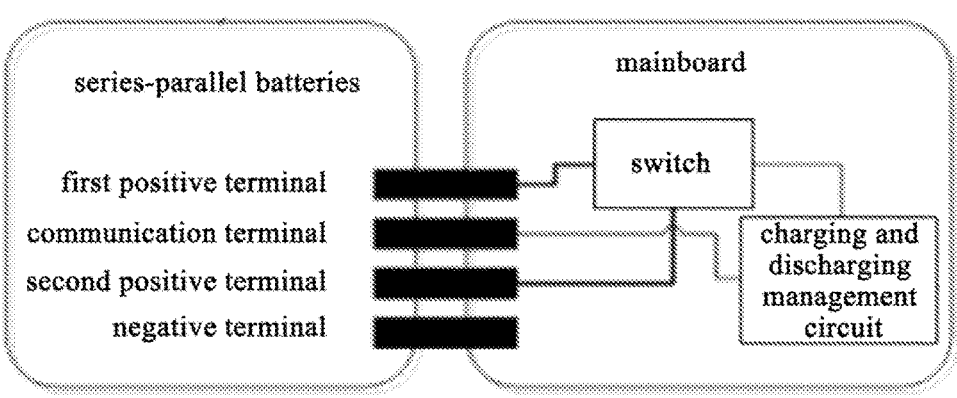
FIG. 3a is a schematic structural diagram of a series-parallel battery system according to the present disclosure.
Figure 3B:
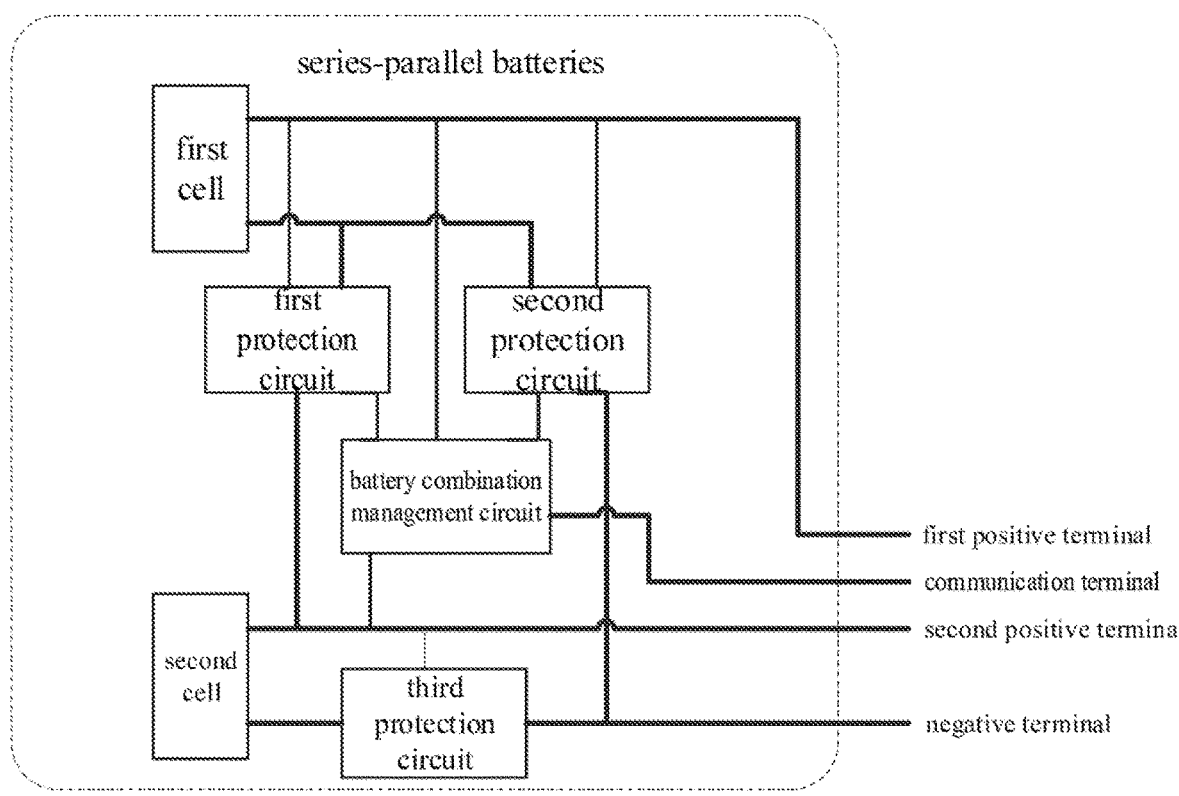

In some implementations, as shown in FIG. 3a and FIG. 3b, the switch is disposed on the mainboard, the mainboard further includes the charging and discharging management circuit, a first end of the switch is connected to a first positive terminal of the series-parallel batteries, a second end of the switch is connected to a second positive terminal of the series-parallel batteries, a third terminal of the switch is connected to a first end of the charging and discharging management circuit, and a second end of the charging and discharging management circuit is connected to a communication terminal of the series-parallel batteries. A first end of the first cell is respectively connected to the first positive terminal of the series-parallel batteries, a third end of the first protection circuit, a third end of the second protection circuit and a third end of the battery combination management circuit, and a second end of the first cell is respectively connected to a first end of the first protection circuit and a first end of the second protection circuit. A first end of the second cell is respectively connected to a second end of the first protection circuit, a third end of the third protection circuit, the second positive terminal of the series-parallel batteries and a fifth end of the battery combination management circuit, and a second end of the second cell is connected to a first end of the third protection circuit. A first end of the battery combination management circuit is connected to a fourth end of the first protection circuit, a second end of the battery combination management circuit is connected to a fourth end of the second protection circuit, and a sixth end of the battery combination management circuit is connected to the communication terminal of the series-parallel batteries. A second end of the third protection circuit is respectively connected to a second end of the second protection circuit and a negative terminal of the series-parallel batteries.

Compared with the solution illustrated by FIGS. 2a and 2b, the solution illustrated by FIGS. 3a and 3b can simplify the circuit inside the series-parallel batteries by moving the switch from the inside of the series-parallel batteries onto the mainboard and using the charging and discharging management circuit to control the on and off of the switch.

The implementations of the present disclosure are explained by taking the solution illustrated by FIG. 2a and FIG. 2b as an example.

In some implementations, in the operation S12, the battery combination management circuit of the series-parallel batteries communicates with the charging and discharging management circuit of the mainboard through the communication terminal, and controls the first cell and the second cell to be connected in series or in parallel according to the charge or discharging demand. With reference to FIG. 2a and FIG. 2b, in the case of the series charging demand, the battery combination management circuit turns off the second protection circuit and the switch and turns on the first protection circuit, so as to enable a whole power supply path to enter from the first positive terminal and pass through the first cell, the first protection circuit, the second cell and the third protection circuit, thereby forming a charging path with the two cells connected in series. In the case of the parallel charging demand, the battery combination management circuit turns off the first protection circuit and turns on the second protection circuit and the switch, so as to enable a whole power supply path to enter from the first positive terminal and pass through the first cell and the second protection circuit and at the same time enter from the second positive terminal and pass through the switch, the second cell and the third protection circuit, thereby forming a charging path with the two cells connected in parallel.

Figure 4:
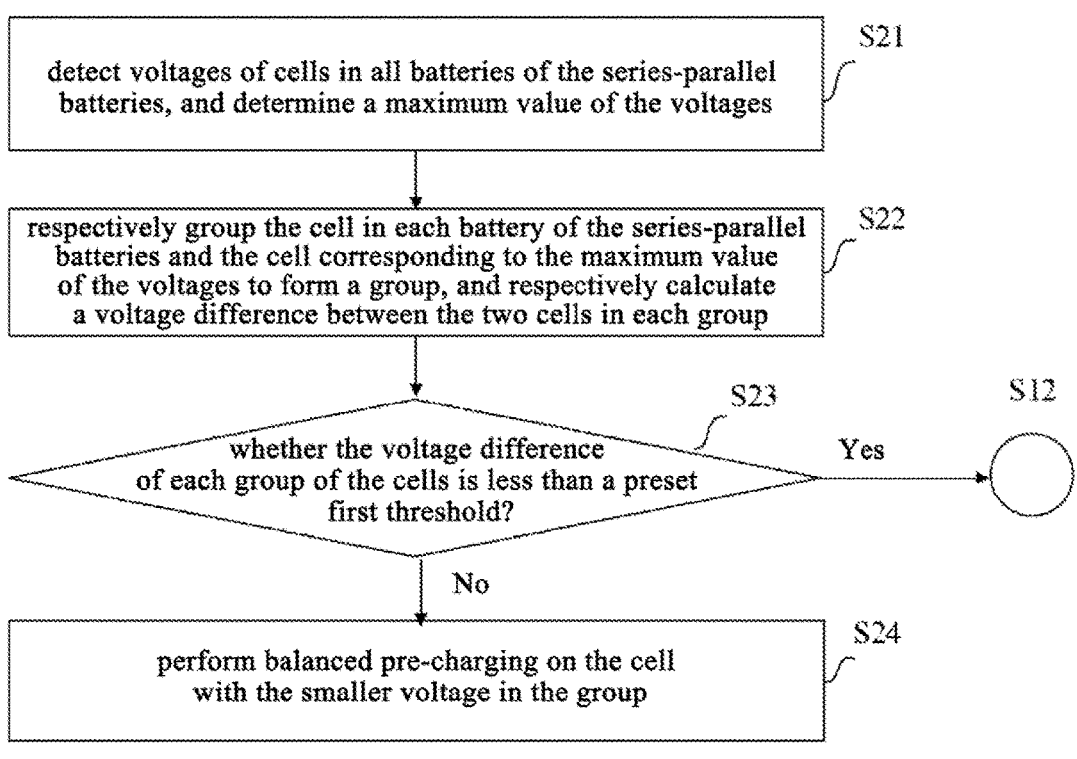
FIG. 4 is a flowchart illustrating a balanced pre-charging process according to the present disclosure.

In some implementations, as shown in FIG. 4, before charging the series-parallel batteries according to the connection mode of each battery of the series-parallel batteries (i.e., the operation S12), the charging and discharging method for series-parallel batteries may further include the following operations S21 to S24.

In operation S21, voltages of cells in all batteries of the series-parallel batteries are detected, and a maximum value of the voltages is determined.

In operation S22, the cell in each battery of the series-parallel batteries and the cell corresponding to the maximum value of the voltages are respectively grouped to form a group, and a voltage difference between the two cells in each group is respectively calculated.

In operation S23, if the voltage difference of at least one group of the cells is greater than or equal to a preset first threshold, operation S24 is performed; and if the voltage difference of each group of the cells is less than the first threshold, the operation S12 is performed.

In some implementations, the first threshold may be 0.02V.

In this operation, if the voltage difference between the two cells is greater than or equal to the first threshold, the cell of the two cells that has the smaller voltage is subjected to balanced pre-charging.

If the voltage difference between any two cells in the series-parallel batteries is less than the first threshold, a series-parallel batteries charging stage may be started, that is, the series-parallel batteries may be charged according to the connection mode of each battery of the series-parallel batteries.

In operation S24, the cell with the smaller voltage in the group is subjected to balanced pre-charging, the voltage of the cell subjected to the balanced pre-charging is detected, and the balanced pre-charging of the cell is stopped until the voltage difference between the two cells in the group is less than the first threshold.

In this operation, during the balanced pre-charging, the battery combination management circuit is desired to detect the voltage of the cell being subjected to the balanced pre-charging, calculate the voltage difference between the two cells in the group again, continue the balanced pre-charging if the voltage difference is still greater than or equal to the first threshold, or stop the balanced pre-charging if the voltage difference is less than the first threshold.

As shown in FIG. 2b, if the first cell has the lower voltage, the battery combination management circuit turns off the first protection circuit and the switch and turns on the second protection circuit, so as to start to perform the balanced pre-charging on the first cell; and if the second cell has the lower voltage, the battery combination management circuit turns off the first protection circuit and the second protection circuit and turns on the switch, so as to start to perform the balanced pre-charging on the second cell.

Each group of the cells in the series-parallel batteries are subjected to the balanced pre-charging according the above operations, and the balanced pre-charging stage is ended and the series-parallel batteries charging stage is started when the voltage difference between the cells in each group is less than the first threshold.

Taking the series-parallel batteries shown in FIG. 2b as an example, the series-parallel batteries include two batteries, resulting in merely one battery group, and the battery combination management circuit determines which one of the first cell and the second cell has the lower voltage, and performs the balanced pre-charging on the cell with the lower voltage. Merely a single cell is charged in the balanced pre-charging process, so that the battery combination management circuit switches to the cell with the lower voltage to perform the balanced pre-charging. If the first cell has the lower voltage, which indicates that the first cell is desired to be subjected to the balanced pre-charging, the battery combination management circuit turns off the switch and the first protection circuit and turns on the second protection circuit, thereby realizing single-battery charging of the first cell. If the second cell has the lower voltage, which indicates that the second cell is desired to be subjected to the balanced pre-charging, the battery combination management circuit turns off the first protection circuit and the second protection circuit and turns on the switch, thereby realizing single-battery charging of the second cell. The charging and discharging management circuit of the mainboard controls a charging current according to a range of a charging curve of a current voltage of the cell, and detects the voltage of the cell being subjected to the balanced pre-charging in the balanced pre-charging process, and ends the balanced pre-charging process when the voltage difference between the first cell and the second cell is less than the first threshold.

Figure 5:
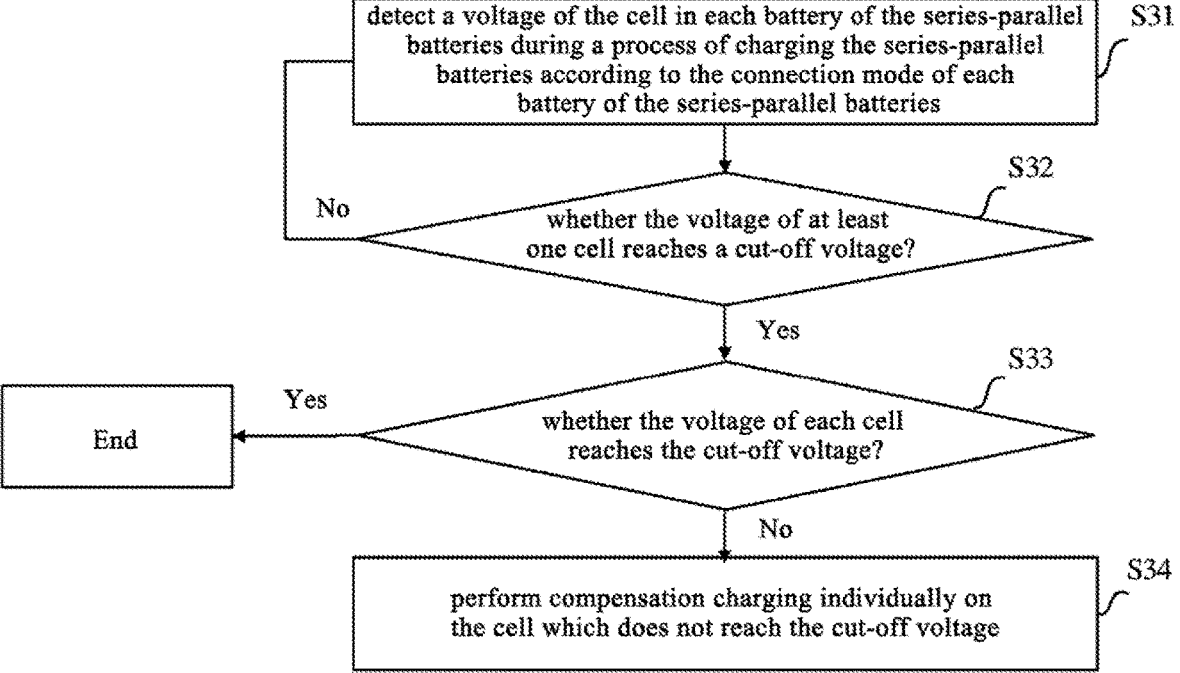
FIG. 5 is a flowchart illustrating a compensation charging process according to the present disclosure.

In some implementations, as shown in FIG. 5, the charging and discharging method for series-parallel batteries may further include the following operations S31 to S34.

In operation S31, a voltage of the cell in each battery of the series-parallel batteries is detected during a process of charging the series-parallel batteries according to the connection mode of each battery of the series-parallel batteries.

In operation S32, if the voltage of at least one cell reaches a cut-off voltage, operation S33 is performed, and if none of the voltages of the cells reaches the cut-off voltage, the operation S31 is performed again.

In this operation, if the voltage of at least one cell reaches the cut-off voltage, it is determined whether the voltages of the cells in all the batteries of the series-parallel batteries reach the cut-off voltage (i.e., the operation S33 is performed). If none of the voltages of the cells in the batteries of the series-parallel batteries reaches the cut-off voltage, the operation S31 is performed again to continuously detect the voltage of the cell in each battery.

In operation S33, if the voltage of at least one cell does not reach the cut-off voltage, operation S34 is performed; otherwise, the process is ended.

In operation S34, the cell which does not reach the cut-off voltage is subjected to compensation charging individually.

In this operation, if a plurality of cells do not reach the cut-off voltage, the cells are separately and individually subjected to the compensation charging.

It should be noted that, when it is determined in the operation S33 and the operation S32 that the voltage of some cell reaches the cut-off voltage, the charging of the cell is desired to be stopped.

Taking the series-parallel batteries shown in FIG. 2b as an example, if the first cell reaches the cut-off voltage while the second cell does not reach the cut-off voltage, the second cell is subjected to the compensation charging individually until the second cell reaches the cut-off voltage. In this case, the battery combination management circuit turns off the first protection circuit and the second protection circuit and turns on the switch, so as to enable the second cell to be charged in a single cell manner according to a charging curve until the second cell reaches the cut-off voltage. If the second cell reaches the cut-off voltage while the first cell does not reach the cut-off voltage, the first cell is subjected to the compensation charging individually until the first cell also reaches the cut-off voltage. In this case, the battery combination management circuit turns off the first protection circuit and the switch and turns on the second protection circuit, so as to enable the first cell to be charged in the single cell manner according to a charging curve until the first cell reaches the cut-off voltage.

With the method provided by the present disclosure, the cell which does not reach the cut-off voltage can be individually charged, the control on the single-battery charging can be achieved, and as compared with the solution where a parallel-connected resistor bypasses other batteries in a multi-battery balanced charging process, the charging efficiency can be increased, quick charge can be realized, and the need for a resistor bypass can be obviated, thereby reducing the corresponding cost. Moreover, a consistency requirement of all the batteries of the series-parallel batteries can be reduced by adopting the compensation charging mechanism, and the corresponding cost can also be reduced.

The compensation charging process of the cell is similar to the balanced pre-charging process of the cell, and a main difference therebetween lies in that the balanced pre-charging process of the cell is to pre-charge the cell with the lower voltage at the beginning of the charging, so as to realize consistency of the voltages of the two cells, while the compensation charging process of the cell is to charge the cell which does not reach the cut-off voltage at the end of the charging until the cell reaches the cut-off voltage.

In some implementations, whether each cell in the series-parallel batteries is in an abnormal state may be detected in the series-parallel batteries charging stage.

In a case where the connection mode of each battery of the series-parallel batteries is the series connection mode, the charging and discharging method for series-parallel batteries may further include: if the voltage of at least one cell reaches the cut-off voltage and the voltage of at least one cell does not reach the cut-off voltage, determining whether the cell in each battery of the series-parallel batteries is abnormal according to the voltage of the cell, which does not reach the cut-off voltage, at the beginning of the compensation charging and a preset second threshold. That is, for the charging in the case where the cells are in the series connection mode, whether the cells are abnormal may be determined before the compensation charging is started or during the compensation charging.

Figure 6:
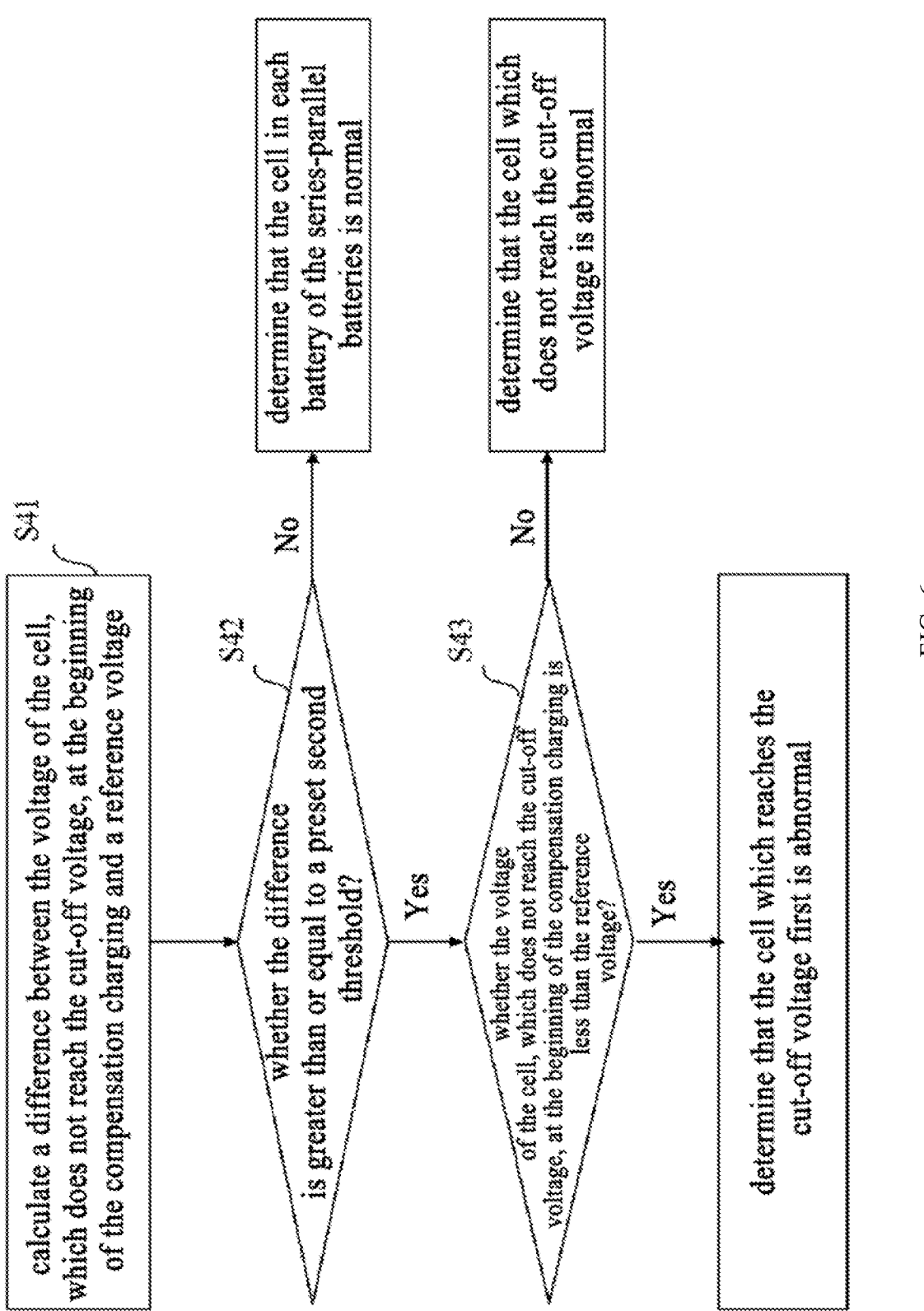
FIG. 6 is a flowchart illustrating a process of determining whether a cell is abnormal in a series connection mode of batteries according to the present disclosure.

In some implementations, as shown in FIG. 6, determining whether the cell in each battery of the series-parallel batteries is abnormal according to the voltage of the cell, which does not reach the cut-off voltage, at the beginning of the compensation charging and the preset second threshold includes the following operations S41 to S43.

In operation S41, a difference between the voltage of the cell, which does not reach the cut-off voltage, at the beginning of the compensation charging and a reference voltage is calculated.

In operation S42, if the difference is greater than or equal to the preset second threshold, operation S43 is performed, and if the difference is less than the preset second threshold, it is determined that the cell in each battery of the series-parallel batteries is normal.

In order to ensure the accuracy of the determination, the second threshold should be less than the first threshold.

In this operation, if the difference between the voltage of the cell, which does not reach the cut-off voltage, at the beginning of the compensation charging and the reference voltage is greater than or equal to the second threshold, it is indicated that the cell is abnormal, so the operation S43 is then performed to determine which cell is abnormal; and if the difference between the voltage of the cell, which does not reach the cut-off voltage, at the beginning of the compensation charging and the reference voltage is less than the second threshold, it is indicated that the cell in each battery of the series-parallel batteries is normal.

In operation S43, if the voltage of the cell, which does not reach the cut-off voltage, at the beginning of the compensation charging is less than the reference voltage, it is determined that the cell which reaches the cut-off voltage first is abnormal, and if the voltage of the cell, which does not reach the cut-off voltage, at the beginning of the compensation charging is greater than or equal to the reference voltage, it is determined that the cell which does not reach the cut-off voltage is abnormal.

In this operation, if the voltage of the cell, which does not reach the cut-off voltage, at the beginning of the compensation charging is less than the reference voltage, it is indicated that the cell which does not reach the cut-off voltage (i.e., the cell which is desired to be subjected to the compensation charging) is normal, and the cell, which reaches the cut-off voltage first, reaches the cut-off voltage too early and is abnormal due to a quick voltage boost. If the voltage of the cell, which does not reach the cut-off voltage, at the beginning of the compensation charging is greater than or equal to the reference voltage, it is indicated that the cell which does not reach the cut-off voltage (i.e., the cell which is desired to be subjected to the compensation charging) suffers from a quick voltage boost, thus being abnormal.

After it is determined that some cell is abnormal, the battery combination management circuit may send an alarm to the mainboard, so as to inform a user to timely replace the battery.

In some implementations, the reference voltage may be an average voltage of the cells subjected to the previous preset number of times of the compensation charging processes at the beginning of the compensation charging processes, the cells subjected to the compensation charging processes are normal cells, and the compensation charging processes are the compensation charging processes in the series connection mode of the batteries. That is, the reference voltage may be an average of voltage values of the cells (the cells are normal) subjected to each compensation charging process at the beginning of the compensation charging process in the previous n times of the series charging processes. For example, n=10, in the previous 10 times of the series charging processes, the voltage values of the cells subjected to each compensation charging process at the beginning of the compensation charging process in the 10 times of the series charging processes are respectively taken, and the average of all the voltage values such taken is calculated. It should be noted that, if the number of times of the compensation charging processes of the cells in the series charging processes does not reach the preset number of times, the number of times of the compensation charging processes that are actually performed may be used as the preset number of times when the reference voltage is calculated.

In some implementations, the charging and discharging method for series-parallel batteries may further include: if the difference between the voltage of the cell, which does not reach the cut-off voltage, at the beginning of the compensation charging and the reference voltage is less than the preset second threshold, updating the reference voltage according to the voltage of the cell subjected to a current compensation charging process at the beginning of the compensation charging process. That is, after it is determined that the cell in each battery of the series-parallel batteries is normal, the voltage (which is the latest reliable data) of the cell subjected to the compensation charging at the beginning of the compensation charging in the current series charging process may be used for updating the reference voltage. That is, if the cell subjected to the compensation charging is normal, the reference voltage is an average including the voltage value of the cell subjected to the current compensation charging process, so as to allow for determination of whether the cell is abnormal during the next compensation charging. If it is found that some cell is abnormal, the reference voltage is not updated, which can ensure the accuracy of the reference voltage.

The dynamic updating of the reference voltage can ensure the accuracy of the reference voltage and improve the accuracy of the determination of whether the cells are abnormal.

In a case where the connection mode of each battery of the series-parallel batteries is the parallel connection mode, after the cell which does not reach the cut-off voltage is subjected to the compensation charging individually (i.e., the operation S34), the charging and discharging method for series-parallel batteries further includes: determining whether the cell subjected to the compensation charging in the series-parallel batteries is abnormal according to compensation charging duration of the cell in each battery of the series-parallel batteries and a preset third threshold. That is, for the charging in the case where the cells are in the parallel connection mode, whether the cells are abnormal may be determined after the compensation charging is completed. It should be noted that the compensation charging duration described herein refers to the compensation charging duration of each cell in the presence of a same compensation charging current.

In the case where the connection mode of each battery of the series-parallel batteries is the parallel connection mode, the compensation charging process is started merely when the cut-off voltages of the cells are different. Taking the series-parallel batteries shown in FIG. 2a and FIG. 2b as an example, in a case where the first cell and the second cell are connected in parallel to be charged, if the first cell does not reach the cut-off voltage while the second cell reaches the cut-off voltage, when the compensation charging process is started, the battery combination management circuit switches the first cell to a single-cell charging mode, stops charging the second cell, and simultaneously informs the charging and discharging management circuit of the mainboard to perform single-cell charging on the first cell, the charging and discharging management circuit of the mainboard controls the charging of the first cell to the end according to the charging curve of the first cell, and at the same time the battery combination management circuit records the charging duration of the whole compensation charging process of the first cell.

Figure 7:
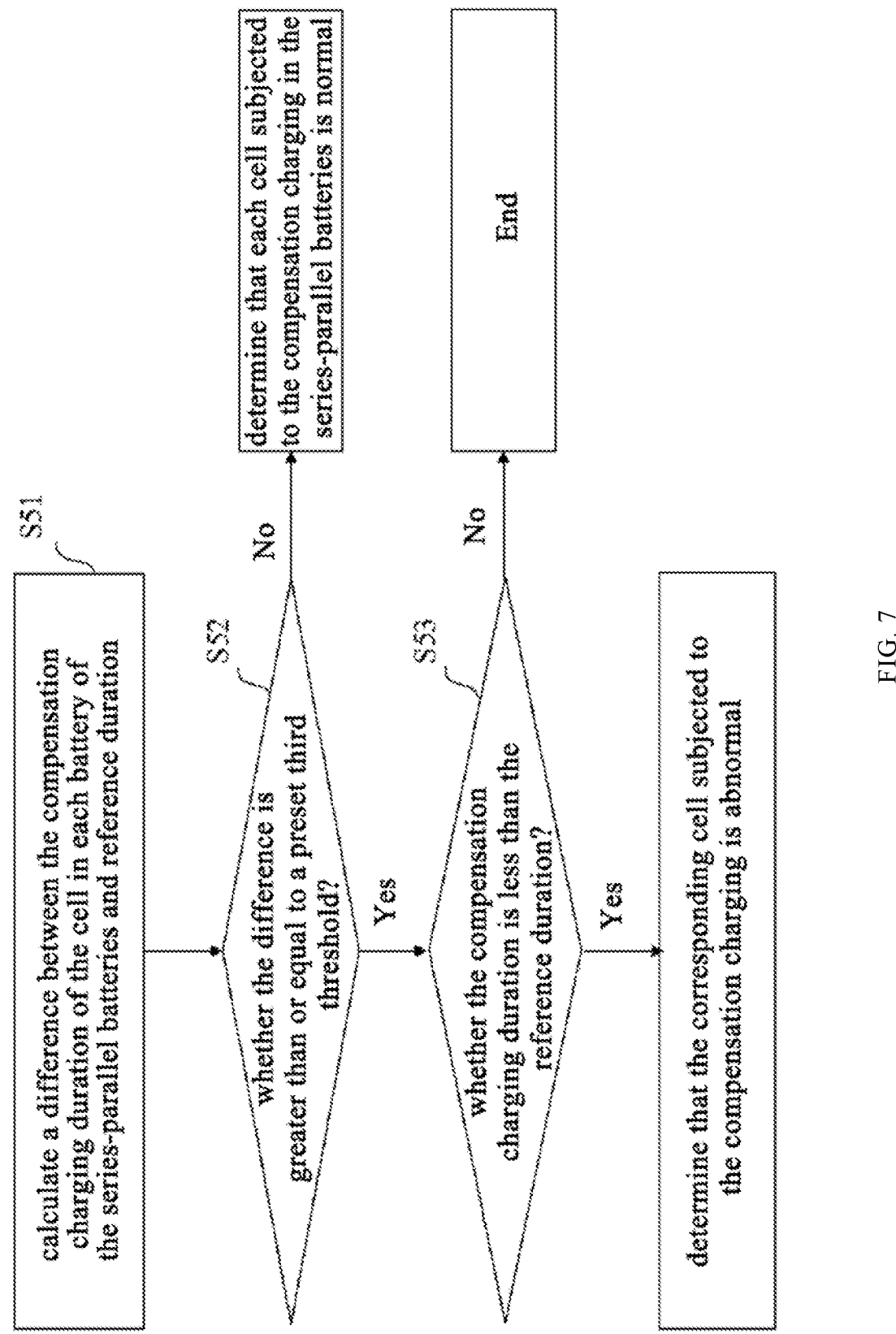
FIG. 7 is a flowchart illustrating a process of determining whether a cell is abnormal in a parallel connection mode of batteries according to the present disclosure.

In some implementations, as shown in FIG. 7, determining whether the cell subjected to the compensation charging in the series-parallel batteries is abnormal according to the compensation charging duration of the cell in each battery of the series-parallel batteries and the preset third threshold includes the following operations S51 to S53.

In operation S51, a difference between the compensation charging duration of the cell in each battery of the series-parallel batteries and reference duration is calculated.

In operation S52, if the difference is greater than or equal to the preset third threshold, operation S53 is performed; and if the difference is less than the preset third threshold, it is determined that each cell subjected to the compensation charging in the series-parallel batteries is normal.

In this operation, if the difference between the compensation charging duration of the cell and the reference duration is greater than or equal to the third threshold, it is indicated that some cell subjected to the compensation charging is abnormal, and the operation S53 is then performed to determine which cell is abnormal; and if the difference between the compensation charging duration of the cell and the reference duration is less than the third threshold, it is indicated that each cell subjected to the compensation charging in the series-parallel batteries is normal.

In operation S53, if the compensation charging duration is less than the reference duration, it is determined that the corresponding cell subjected to the compensation charging is abnormal, and if the compensation charging duration is greater than or equal to the reference duration, the process is ended.

In this operation, if the compensation charging duration is less than the reference duration, it is indicated that the capacity of the corresponding cell subjected to the compensation charging is reduced, with the result that the cell is abnormal. If the compensation charging duration is greater than or equal to the reference duration, it is impossible to determine which cell is abnormal, so that the process is ended.

After it is determined that some cell is abnormal, the battery combination management circuit may send an alarm to the mainboard, so as to inform the user to timely replace the battery.

In some implementations, the reference duration may be an average duration of the cells subjected to the previous preset number of times of the compensation charging processes, the cells subjected to the compensation charging processes are normal cells, and the compensation charging processes are the compensation charging processes in the parallel connection mode of the batteries. That is, the reference duration may be an average of duration of the cells (the cells are normal) subjected to each compensation charging process in the previous m times of the parallel charging processes. For example, m=10, in the previous 10 times of the parallel charging processes, the compensation charging duration in each of the 10 times of the parallel charging processes is respectively taken, and the average of all the compensation charging duration such taken is calculated. It should be noted that, if the number of times of the compensation charging processes of the cells in the parallel charging processes does not reach the preset number of times, the number of times of the compensation charging processes that are actually performed may be used as the preset number of times when the reference duration is calculated.

In some implementations, the charging and discharging method for series-parallel batteries may further include: if the difference between the compensation charging duration of the cell and the reference duration is less than the preset third threshold, updating the reference duration according to the compensation charging duration of the cell subjected to a current compensation charging process. That is, after it is determined that each cell subjected to the compensation charging in the series-parallel batteries is normal, the compensation charging duration (which is the latest reliable data) of the cell subjected to the compensation charging in the current parallel charging process may be used for updating the reference duration. That is, if the cell subjected to the compensation charging is normal, the reference duration is an average including the current compensation charging duration, so as to allow for determination of whether the cell is abnormal during the next compensation charging. If it is found that some cell is abnormal, the reference duration is not updated, which may ensure the accuracy of the reference duration.

The dynamic updating of the reference duration can ensure the accuracy of the reference duration and improve the accuracy of the determination of whether the cells are abnormal.

The charging and discharging method for series-parallel batteries provided by the implementations of the present disclosure may also realize various types of discharging of the series-parallel batteries, such as the parallel output discharging, the multi-path independent output discharging and the series output discharging.

In some implementations, as shown in FIG. 2a and FIG. 2b, according to the discharging demand, the series-parallel batteries may respectively use the first cell and the second cell to independently supply power to the mainboard through the different positive terminals (i.e., the multi-path independent output discharging), or may discharge with the first cell and the second cell connected in parallel, or may discharge the first cell and the second cell connected in series.

In the case of the multi-path independent output discharging, the battery combination management circuit turns off the first protection circuit and the switch and turns on the second protection circuit, so as to enable the first cell to supply power to the mainboard through the first positive terminal and enable the second cell to supply power to the mainboard through the second positive terminal.

In the case of the parallel output discharging, the battery combination management circuit turns off the first protection circuit and turns on the second protection circuit and the switch, so as to enable the first cell and the second cell to supply power to the mainboard through the first positive terminal and the second positive terminal (with the first positive terminal and the second positive terminal connected together).

The series output discharging may include one path of series output discharging and one path of individual discharging. With reference to FIG. 2a and FIG. 2b, in the case of the one path of series output discharging and the one path of individual discharging, the battery combination management circuit turns off the second protection circuit and the switch and turns on the first protection circuit, so as to enable the first cell and the second cell to be connected in series to supply power to the mainboard through the first positive terminal and enable the second cell to supply power to the mainboard through the second positive terminal. The first positive terminal provides a high voltage from the series connection of the two cells, and the second positive terminal provides a low voltage from the single cell, so that a high voltage requirement can be met, and part of a conversion loss, which is caused by converting a low voltage to a high voltage, can be reduced.

The implementations illustrated by FIG. 3a and FIG. 3b differ from the implementations illustrated by FIG. 2a and FIG. 2b in that the on and off of the switch is controlled by the charging and discharging management circuit of the mainboard, and the balanced pre-charging process of the cells, the compensation charging process of the cells, and the process of determining whether the cells are abnormal in the implementations illustrated by FIG. 3a and FIG. 3b are the same as those in the implementations illustrated by FIG. 2a and FIG. 2b, and thus will not be repeated here.

In some implementations, as shown in FIG. 3a and FIG. 3b, the series-parallel batteries may be charged with the first cell and the second cell connected in parallel or in series according to the charging demand. If the charging demand is the series charging demand, the battery combination management circuit turns off the second protection circuit and turns on the first protection circuit, and the charging and discharging management circuit turns off the switch, so as to enable a whole power supply path to enter from the first positive terminal and passes through the first cell, the first protection circuit, the second cell and the third protection circuit, thereby forming a charging path with the two cells connected in series. If the charging demand is the parallel charging demand, the battery combination management circuit turns off the first protection circuit and turns on the second protection circuit, and the charging and discharging management circuit turns on the switch, so as to enable a whole power supply path to enter from the first positive terminal and pass through the first cell and the second protection circuit and at the same time enter from the second positive terminal through the switch and pass through the second cell and the third protection circuit, thereby forming a charging path with the two cells connected in parallel.

In some implementations, as shown in FIG. 3a and FIG. 3b, according to the discharging demand, the series-parallel batteries may respectively use the first cell and the second cell to independently supply power to the mainboard through the different positive terminals (i.e., the multi-path independent output discharging), or may discharge with the first cell and the second cell connected in parallel, or may discharge with the first cell and the second cell connected in series.

In the case of the multi-path independent output discharging, the battery combination management circuit turns off the first protection circuit and turns on the second protection circuit, and the charging and discharging management circuit turns off the switch, so as to enable the first cell to supply power to the mainboard through the first positive terminal and enable the second cell to supply power to the mainboard through the second positive terminal.

In the case of the parallel output discharging, the battery combination management circuit turns off the first protection circuit and turns on the second protection circuit, and the charging and discharging management circuit turns on the switch, so as to enable the first cell and the second cell to supply power to the mainboard through the first positive terminal and the second positive terminal (with the first positive terminal and the second positive terminal connected together).

The series output discharging may include one path of series output discharging and one path of individual discharging. In the case of the one path of series output discharging and the one path of individual discharging, the battery combination management circuit turns off the second protection circuit and turns on the first protection circuit, and the charging and discharging management circuit turns off the switch, so as to enable the first cell and the second cell to be connected in series to supply power to the mainboard through the first positive terminal and enable the second cell to supply power to the mainboard through the second positive terminal. The first positive terminal provides a high voltage from the series connection of the two cells, and the second positive terminal provides a low voltage from the single cell, so that a high voltage requirement can be met, and part of a conversion loss, which is caused by converting a low voltage to a high voltage, can be reduced.

Based on the same technical concept, the implementations of the present disclosure further provide the series-parallel battery system, as shown in FIG. 8, including the series-parallel batteries and the mainboard, which are connected to each other, the mainboard includes the charging and discharging management circuit, the series-parallel batteries include the battery combination management circuit and the at least two batteries that are connected to each other, the charging and discharging management circuit is connected to the battery combination management circuit and is configured to determine a charging or discharging demand type, and send a corresponding adjustment instruction to the battery combination management circuit according to the charging or discharging demand type; and the battery combination management circuit is configured to adjust a connection mode of the batteries according to the adjustment instruction, and perform charging or discharging according to the connection mode of the batteries.

In some implementations, the series-parallel batteries at least further include: the first cell, the second cell, the first protection circuit, the second protection circuit and the third protection circuit, the first cell, the first protection circuit and the second protection circuit belong to the same battery, and the second cell and the third protection circuit belong to the same battery; and the series-parallel battery system further includes the switch configured to adjust the connection mode of each battery, and the switch is disposed inside the series-parallel batteries or on the mainboard.

In some implementations, the switch is disposed inside the series-parallel batteries, a first end of the switch is connected to a first end of the first cell and a first positive terminal of the series-parallel batteries, a second end of the switch is connected to a first end of the second cell and a second positive terminal of the series-parallel batteries, and a third end of the switch is connected to a fourth end of the battery combination management circuit; the first end of the first cell is respectively connected to the first positive terminal of the series-parallel batteries, a third end of the first protection circuit, a third end of the second protection circuit and a third end of the battery combination management circuit, and a second end of the first cell is respectively connected to a first end of the first protection circuit and a first end of the second protection circuit; the first end of the second cell is respectively connected to a second end of the first protection circuit, a third end of the third protection circuit, the second positive terminal of the series-parallel batteries and a fifth end of the battery combination management circuit, and a second end of the second cell is connected to a first end of the third protection circuit; a first end of the battery combination management circuit is connected to a fourth end of the first protection circuit, a second end of the battery combination management circuit is connected to a fourth end of the second protection circuit, and a sixth end of the battery combination management circuit is connected to a communication terminal of the series-parallel batteries; a second end of the third protection circuit is respectively connected to a second end of the second protection circuit and a negative terminal of the series-parallel batteries; and the charging and discharging management circuit is connected to the communication terminal of the series-parallel batteries.

In some implementations, the switch is disposed on the mainboard, a first end of the switch is connected to a first positive terminal of the series-parallel batteries, a second end of the switch is connected to a second positive terminal of the series-parallel batteries, a third terminal of the switch is connected to a first end of the charging and discharging management circuit, and a second end of the charging and discharging management circuit is connected to a communication terminal of the series-parallel batteries; a first end of the first cell is respectively connected to the first positive terminal of the series-parallel batteries, a third end of the first protection circuit, a third end of the second protection circuit and a third end of the battery combination management circuit, and a second end of the first cell is respectively connected to a first end of the first protection circuit and a first end of the second protection circuit; a first end of the second cell is respectively connected to a second end of the first protection circuit, a third end of the third protection circuit, the second positive terminal of the series-parallel batteries and a fifth end of the battery combination management circuit, and a second end of the second cell is connected to a first end of the third protection circuit; a first end of the battery combination management circuit is connected to a fourth end of the first protection circuit, a second end of the battery combination management circuit is connected to a fourth end of the second protection circuit, and a sixth end of the battery combination management circuit is connected to the communication terminal of the series-parallel batteries; and a second end of the third protection circuit is respectively connected to a second end of the second protection circuit and a negative terminal of the series-parallel batteries.

In some implementations, the charging and discharging management circuit is further configured to, before the charging and discharging management circuit performs the charging on the series-parallel batteries according to the connection mode of each battery of the series-parallel batteries, detect voltages of cells in all the batteries of the series-parallel batteries, and determine a maximum value of the voltages; respectively group the cell in each battery of the series-parallel batteries and the cell corresponding to the maximum value of the voltages to form a group, and respectively calculate a voltage difference between the two cells in each group; if the voltage difference of at least one group of the cells is greater than or equal to a preset first threshold, perform balanced pre-charging on the cell with the smaller voltage in the group, and detect the voltage of the cell subjected to the balanced pre-charging, and stop the balanced pre-charging of the cell until the voltage difference between the two cells in the group is less than the first threshold; and if the voltage difference of each group of the cells is less than the first threshold, perform the charging on the series-parallel batteries according to the connection mode of each battery of the series-parallel batteries.

In some implementations, the charging and discharging management circuit is further configured to detect a voltage of the cell in each battery of the series-parallel batteries when the battery combination management circuit performs the charging on the series-parallel batteries according to the connection mode of each battery of the series-parallel batteries; and if the voltage of at least one cell reaches a cut-off voltage and the voltage of at least one cell does not reach the cut-off voltage, instruct the battery combination management circuit to perform compensation charging individually on the cell which does not reach the cut-off voltage.

In some implementations, when the connection mode of each battery of the series-parallel batteries is a series connection mode, the battery combination management circuit is further configured to, if the voltage of at least one cell reaches the cut-off voltage and the voltage of at least one cell does not reach the cut-off voltage, determine whether the cell in each battery of the series-parallel batteries is abnormal according to the voltage of the cell, which does not reach the cut-off voltage, at the beginning of the compensation charging and a preset second threshold; and when the connection mode of each battery of the series-parallel batteries is a parallel connection mode, the charging and discharging management circuit is further configured to, after the cell which does not reach the cut-off voltage is subjected to the compensation charging individually, determine whether the cell subjected to the compensation charging in the series-parallel batteries is abnormal according to compensation charging duration of the cell in each battery of the series-parallel batteries and a preset third threshold.

In some implementations, when the connection mode of each battery of the series-parallel batteries is the series connection mode, the battery combination management circuit is configured to calculate a difference between the voltage of the cell, which does not reach the cut-off voltage, at the beginning of the compensation charging and a reference voltage; if the difference is greater than or equal to the preset second threshold and the voltage of the cell, which does not reach the cut-off voltage, at the beginning of the compensation charging is less than the reference voltage, determine that the cell which reaches the cut-off voltage first is abnormal; if the difference is greater than or equal to the preset second threshold and the voltage of the cell, which does not reach the cut-off voltage, at the beginning of the compensation charging is greater than or equal to the reference voltage, determine that the cell which does not reach the cut-off voltage is abnormal; and if the difference is less than the preset second threshold, determine that the cell in each battery of the series-parallel batteries is normal.

In some implementations, the reference voltage is an average voltage of the cells subjected to the previous preset number of times of the compensation charging processes at the beginning of the compensation charging processes, the cells subjected to the compensation charging processes are normal cells, and the compensation charging processes are the compensation charging processes in the series connection mode of the batteries; and the charging and discharging management circuit is further configured to update the reference voltage according to the voltage of the cell subjected to the current compensation charging process at the beginning of the compensation charging if the difference is less than the preset second threshold.

In some implementations, when the connection mode of each battery of the series-parallel batteries is the parallel connection mode, the battery combination management circuit is configured to calculate a difference between the compensation charging duration of the cell in each battery of the series-parallel batteries and reference duration; if the difference is greater than or equal to the preset third threshold and the compensation charging duration is less than the reference duration, determine that the corresponding cell subjected to the compensation charging is abnormal; and if the difference is less than the preset third threshold, determine that each cell subjected to the compensation charging in the series-parallel batteries is normal.

In some implementations, the reference duration is an average duration of the cells subjected to the previous preset number of times of the compensation charging processes, the cells subjected to the compensation charging processes are normal cells, and the compensation charging processes are the compensation charging processes in the parallel connection mode of the batteries; and the charging and discharging management circuit is further configured to update the reference duration according to the compensation charging duration of the cell subjected to a current compensation charging process if the difference is less than the preset third threshold.

In some implementations, the discharging demand type includes: parallel output discharging, multi-path independent output discharging and series output discharging; and/or the charging demand type includes: parallel charging and series charging.

The series-parallel battery system provided herein includes the series-parallel batteries and the mainboard, which are connected to each other, the mainboard includes the charging and discharging management circuit, the series-parallel batteries include the battery combination management circuit and the at least two batteries that are connected to each other, the charging and discharging management circuit is connected to the battery combination management circuit and is configured to determine the charging or discharging demand type, and send the corresponding adjustment instruction to the battery combination management circuit according to the charging or discharging demand type; and the battery combination management circuit is configured to adjust the connection mode of the batteries according to the adjustment instruction, and perform the charging or discharging according to the connection mode of the batteries; and the cells in all the batteries of the series-parallel batteries can adopt the series connection mode or the parallel connection mode according to the charging and discharging demand, which can, as compared with the existing single-battery power supply system, convert the voltage of the series-connected batteries to the voltage of the single battery without the power supply chip and thus effectively increase the discharging efficiency, and can also, as compared with the existing fixed series charging method, obviate the need to add the booster circuit to make the 5V power supply adapt to the charging of the series-connected batteries and thus effectively increase the charging efficiency.

It should be understood by those of ordinary skill in the art that the functional modules/units in all or some of the operations and the devices in the method disclosed above may be implemented as software, firmware, hardware, or suitable combinations thereof. If implemented as hardware, the division between the functional modules/units stated above is not necessarily corresponding to the division of physical components; for example, one physical component may have a plurality of functions, or one function or operation may be performed through cooperation of several physical components. Some or all of the physical components may be implemented as software executed by a processor, such as a central processing unit, a digital signal processor or a microprocessor, or may be implemented as hardware, or may be implemented as an integrated circuit, such as an application specific integrated circuit. Such software may be distributed on a computer-readable medium, which may include a computer storage medium (or a non-transitory medium) and a communication medium (or a transitory medium). As well known by those of ordinary skill in the art, the term "computer storage medium" includes volatile/nonvolatile and removable/non-removable media used in any method or technology for storing information (such as computer-readable instructions, data structures, program modules and other data). The computer storage medium includes, but is not limited to, a Random Access Memory (RAM), a Read-Only Memory (ROM), an Electrically Erasable Programmable Read-Only Memory (EEPROM), a flash memory or other memory techniques, a Compact Disc Read Only Memory (CD-ROM), a Digital Versatile Disc (DVD) or other optical discs, a magnetic cassette, a magnetic tape, a magnetic disk or other magnetic storage devices, or any other medium which can be configured to store desired information and can be accessed by a computer. In addition, it is well known by those of ordinary skill in the art that the communication media generally include computer-readable instructions, data structures, program modules, or other data in modulated data signals such as carrier wave or other transmission mechanism, and may include any information delivery medium.

The present disclosure discloses the exemplary implementations using specific terms, but the terms are merely used and should be merely interpreted as having general illustrative meanings, rather than for the purpose of limitation. Unless expressly stated, it is apparent to those of ordinary skill in the art that features, characteristics and/or elements described in connection with a particular implementation can be used alone or in combination with features, characteristics and/or elements described in connection with other implementations. Therefore, it should be understood by those of ordinary skill in the art that various changes in the forms and the details can be made without departing from the scope of the present disclosure of the appended claims.

What is claimed is:

1. A charging and discharging method for series-parallel battery assembly applied to a series-parallel battery system comprising a series-parallel battery assembly and a mainboard, wherein the series-parallel battery assembly is connected to the mainboard and comprises at least two batteries that are connected to each other, and the method comprises:

determining and adjusting a connection mode of each battery of the series-parallel battery assembly according to a charging or discharging demand type; and charging or discharging the series-parallel battery assembly according to the connection mode of each battery of the series-parallel battery assembly, wherein the series-parallel battery assembly at least comprises: a battery combination management circuit, a first cell, a second cell, a first protection circuit, a second protection circuit and a third protection circuit;

one battery of the series-parallel battery assembly comprises the first cell, the first protection circuit and the second protection circuit, and another battery of the series-parallel battery assembly comprises the second cell and the third protection circuit, wherein in each battery, the cell stores electric energy, and the protection circuit detects voltages and currents at two ends of the cell so as to perform overcharge protection and over-discharge protection on the cell; and the series-parallel battery system further comprises one switch configured to adjust the connection mode of each battery, and the one switch is disposed inside the series-parallel battery assembly or on the mainboard.

2. The method of claim 1, wherein the one switch is disposed inside the series-parallel battery assembly, a first end of the one switch is connected to a first end of the first cell and a first positive terminal of the series-parallel battery assembly, a second end of the one switch is connected to a first end of the second cell and a second positive terminal of the series-parallel battery assembly, and a third end of the one switch is connected to a fourth end of the battery combination management circuit;

the first end of the first cell is respectively connected to the first positive terminal of the series-parallel battery assembly, a third end of the first protection circuit, a third end of the second protection circuit and a third end of the battery combination management circuit, and a second end of the first cell is respectively connected to a first end of the first protection circuit and a first end of the second protection circuit;

the first end of the second cell is respectively connected to a second end of the first protection circuit, a third end of the third protection circuit, the second positive terminal of the series-parallel battery assembly and a fifth end of the battery combination management circuit, and a second end of the second cell is connected to a first end of the third protection circuit;

a first end of the battery combination management circuit is connected to a fourth end of the first protection circuit, a second end of the battery combination management circuit is connected to a fourth end of the second protection circuit, and a sixth end of the battery combination management circuit is connected to a communication terminal of the series-parallel battery assembly;

a second end of the third protection circuit is respectively connected to a second end of the second protection circuit and a negative terminal of the series-parallel battery assembly; and the mainboard comprises a charging and discharging management circuit, and the charging and discharging management circuit is connected to the communication terminal of the series-parallel battery assembly.

3. The method of claim 1, wherein the one switch is disposed on the mainboard, the mainboard further comprises a charging and discharging management circuit, a first end of the one switch is connected to a first positive terminal of the series-parallel battery assembly, a second end of the one switch is connected to a second positive terminal of the series-parallel battery assembly, a third terminal of the one switch is connected to a first end of the charging and discharging management circuit, and a second end of the charging and discharging management circuit is connected to a communication terminal of the series-parallel battery assembly;

a first end of the first cell is respectively connected to the first positive terminal of the series-parallel battery assembly, a third end of the first protection circuit, a third end of the second protection circuit and a third end of the battery combination management circuit, and a second end of the first cell is respectively connected to a first end of the first protection circuit and a first end of the second protection circuit;

a first end of the second cell is respectively connected to a second end of the first protection circuit, a third end of the third protection circuit, the second positive terminal of the series-parallel battery assembly and a fifth end of the battery combination management circuit, and a second end of the second cell is connected to a first end of the third protection circuit;

a first end of the battery combination management circuit is connected to a fourth end of the first protection circuit, a second end of the battery combination management circuit is connected to a fourth end of the second protection circuit, and a sixth end of the battery combination management circuit is connected to the communication terminal of the series-parallel battery assembly; and a second end of the third protection circuit is respectively connected to a second end of the second protection circuit and a negative terminal of the series-parallel battery assembly.

4. The method of claim 1, before the charging the series-parallel battery assembly according to the connection mode of each battery of the series-parallel battery assembly, further comprising:

detecting voltages of cells in all the batteries of the series-parallel battery assembly, and determining a maximum value of the voltages;

respectively grouping a cell in each battery of the series-parallel battery assembly and a cell corresponding to the maximum value of the voltages to form a group, and respectively calculating a voltage difference between both cells in each group;

in response to a voltage difference of at least one group of cells being greater than or equal to a preset first threshold, performing balanced pre-charging on a cell with a smaller voltage in the group, detecting a voltage of the cell subjected to the balanced pre-charging, and stopping the balanced pre-charging of the cell until the voltage difference between both cells in the group is less than the first threshold; and in response to a voltage difference of each group of cells being less than the first threshold, charging the series-parallel battery assembly according to the connection mode of each battery of the series-parallel battery assembly.

5. The method of claim 1, further comprising:

detecting a voltage of a cell in each battery of the series-parallel battery assembly when the series-parallel battery assembly is charged according to the connection mode of each battery of the series-parallel battery assembly; and in response to a voltage of at least one cell reaching a cut-off voltage and a voltage of at least one cell not reaching the cut-off voltage, performing compensation charging individually on the cell which does not reach the cut-off voltage.

6. The method of claim 5, wherein in a case where the connection mode of each battery of the series-parallel battery assembly is a series connection mode, the method further comprises: in response to the voltage of the at least one cell reaching the cut-off voltage and the voltage of the at least one cell not reaching the cut-off voltage, determining whether the cell in each battery of the series-parallel battery assembly is abnormal according to the voltage of the cell, which does not reach the cut-off voltage, at a beginning of the compensation charging and a preset second threshold; and in a case where the connection mode of each battery of the series-parallel battery assembly is a parallel connection mode, after the compensation charging is individually performed on the cell which does not reach the cut-off voltage, the method further comprises: determining whether the cell subjected to the compensation charging in the series-parallel battery assembly is abnormal according to a compensation charging duration of the cell in each battery of the series-parallel battery assembly and a preset third threshold.

7. The method of claim 6, wherein the determining whether the cell in each battery of the series-parallel battery assembly is abnormal according to the voltage of the cell, which does not reach the cut-off voltage, at the beginning of the compensation charging and the preset second threshold comprises:

calculating a difference between the voltage of the cell, which does not reach the cut-off voltage, at the beginning of the compensation charging and a reference voltage;

in response to the difference being greater than or equal to the preset second threshold and the voltage of the cell, which does not reach the cut-off voltage, at the beginning of the compensation charging is less than the reference voltage, determining that a cell which reaches the cut-off voltage first is abnormal;

in response to the difference being greater than or equal to the preset second threshold and the voltage of the cell, which does not reach the cut-off voltage, at the beginning of the compensation charging is greater than or equal to the reference voltage, determining that the cell which does not reach the cut-off voltage is abnormal; and in response to the difference being less than the preset second threshold, determining that the cell in each battery of the series-parallel battery assembly is normal.

8. The method of claim 7, wherein the reference voltage is an average voltage of cells subjected to previous preset number of times of compensation charging processes at respective beginning of the compensation charging processes, the cells subjected to the compensation charging processes are normal cells, and the compensation charging processes are compensation charging processes in the series connection mode of the batteries; and the method further comprises:

in response to the difference being less than the preset second threshold, updating the reference voltage according to the voltage of the cell subjected to a current compensation charging process at the beginning of the compensation charging process.

9. The method of claim 6, wherein determining whether the cell subjected to the compensation charging in the series-parallel battery assembly is abnormal according to the compensation charging duration of the cell in each battery of the series-parallel battery assembly and the preset third threshold comprises:

calculating a difference between the compensation charging duration of the cell in each battery of the series-parallel battery assembly and a reference duration;

in response to the difference being greater than or equal to the preset third threshold and the compensation charging duration is less than the reference duration, determining that the corresponding cell subjected to the compensation charging is abnormal; and in response to the difference being less than the preset third threshold, determining that each cell subjected to the compensation charging in the series-parallel battery assembly is normal.

10. The method of claim 9, wherein the reference duration is an average duration of cells subjected to previous preset number of times of compensation charging processes, the cells subjected to the compensation charging processes are normal cells, and the compensation charging processes are compensation charging processes in the parallel connection mode of the batteries; and the method further comprises:

in response to the difference being less than the preset third threshold, updating the reference duration according to the compensation charging duration of the cell subjected to a current compensation charging process.

11. The method of claim 1, wherein the discharging demand type comprises:

parallel output discharging, multi-path independent output discharging and series output discharging; and/or the charging demand type comprises: parallel charging and series charging.

12. A series-parallel battery system, comprising a series-parallel battery assembly and a mainboard, which are connected to each other, wherein the mainboard comprises a charging and discharging management circuit, the series-parallel battery assembly comprises a battery combination management circuit, and at least two batteries that are connected to each other, the charging and discharging management circuit is connected to the battery combination management circuit and is configured to determine a charging or discharging demand type, and send a corresponding adjustment instruction to the battery combination management circuit according to the charging or discharging demand type; and the battery combination management circuit is configured to adjust a connection mode of the batteries according to the adjustment instruction, and perform charging or discharging on the series-parallel battery assembly according to the connection mode of each battery of the series-parallel battery assembly, wherein the series-parallel battery assembly at least further comprises: a first cell, a second cell, a first protection circuit, a second protection circuit and a third protection circuit;

one battery of the series-parallel battery assembly comprises the first cell, the first protection circuit and the second protection circuit, and another battery of the series-parallel battery assembly comprises the second cell and the third protection circuit, wherein in each battery, the cell stores electric energy, and the protection circuit detects voltages and currents at two ends of the cell so as to perform overcharge protection and over-discharge protection on the cell; and the series-parallel battery system further comprises one switch configured to adjust the connection mode of each battery, and the one switch is disposed inside the series-parallel battery assembly or on the mainboard.

13. The series-parallel battery system of claim 12, wherein the charging and discharging management circuit is further configured to, before the charging and discharging management circuit performs the charging on the series-parallel battery assembly according to the connection mode of each battery of the series-parallel battery assembly, detect voltages of cells in all the batteries of the series-parallel battery assembly, and determine a maximum value of the voltages; respectively group a cell in each battery of the series-parallel battery assembly and a cell corresponding to the maximum value of the voltages to form a group, and respectively calculate a voltage difference between both cells in each group; in response to the voltage difference of at least one group of cells being greater than or equal to a preset first threshold, perform balanced pre-charging on a cell with a smaller voltage in the group, and detect a voltage of the cell subjected to the balanced pre-charging, and stop the balanced pre-charging of the cell until the voltage difference between both cells in the group is less than the first threshold; and in response to a voltage difference of each group of cells being less than the first threshold, perform the charging on the series-parallel battery assembly according to the connection mode of each battery of the series-parallel battery assembly.

14. The series-parallel battery system of claim 13, wherein the charging and discharging management circuit is further configured to detect a voltage of a cell in each battery of the series-parallel battery assembly when the battery combination management circuit performs the charging on the series-parallel battery assembly according to the connection mode of each battery of the series-parallel battery assembly; and in response to a voltage of at least one cell reaching a cut-off voltage and a voltage of at least one cell not reaching the cut-off voltage, instruct the battery combination management circuit to perform compensation charging individually on the cell which does not reach the cut-off voltage.

15. The series-parallel battery system of claim 14, wherein, in a case where the connection mode of each battery of the series-parallel battery assembly is a series connection mode, the battery combination management circuit is further configured to, in response to the voltage of the at least one cell reaching the cut-off voltage and the voltage of the at least one cell not reaching the cut-off voltage, determine whether the cell in each battery of the series-parallel battery assembly is abnormal according to the voltage of the cell, which does not reach the cut-off voltage, at a beginning of the compensation charging and a preset second threshold; and in a case where the connection mode of each battery of the series-parallel battery assembly is a parallel connection mode, the charging and discharging management circuit is further configured to, after the compensation charging is individually performed on the cell which does not reach the cut-off voltage, determine whether the cell subjected to the compensation charging in the series-parallel battery assembly is abnormal according to a compensation charging duration of the cell in each battery of the series-parallel battery assembly and a preset third threshold.

16. The series-parallel battery system of claim 15, wherein, in a case where the connection mode of each battery of the series-parallel battery assembly is the series connection mode, the battery combination management circuit is configured to calculate a difference between the voltage of the cell, which does not reach the cut-off voltage, at the beginning of the compensation charging and a reference voltage; in response to the difference being greater than or equal to the preset second threshold and the voltage of the cell, which does not reach the cut-off voltage, at the beginning of the compensation charging is less than the reference voltage, determine that a cell which reaches the cut-off voltage first is abnormal; in response to the difference being greater than or equal to the preset second threshold and the voltage of the cell, which does not reach the cut-off voltage, at the beginning of the compensation charging is greater than or equal to the reference voltage, determine that the cell which does not reach the cut-off voltage is abnormal; and in response to the difference being less than the preset second threshold, determine that the cell in each battery of the series-parallel battery assembly is normal.

17. The series-parallel battery system of claim 16, wherein the reference voltage is an average voltage of cells subjected to previous preset number of times of compensation charging processes at respective beginning of the compensation charging processes, the cells subjected to the compensation charging processes are normal cells, and the compensation charging processes are compensation charging processes in the series connection mode of the batteries; and the charging and discharging management circuit is further configured to update the reference voltage according to the voltage of the cell subjected to a current compensation charging process at the beginning of the compensation charging, in response to the difference being less than the preset second threshold.

18. The series-parallel battery system of claim 15, wherein, in a case where the connection mode of each battery of the series-parallel battery assembly is the parallel connection mode, the battery combination management circuit is configured to calculate a difference between the compensation charging duration of the cell in each battery of the series-parallel battery assembly and a reference duration; in response to the difference being greater than or equal to the preset third threshold and the compensation charging duration is less than the reference duration, determine that the corresponding cell subjected to the compensation charging is abnormal; and in response to the difference being less than the preset third threshold, determine that each cell subjected to the compensation charging in the series-parallel battery assembly is normal.

19. The series-parallel battery system of claim 18, wherein the reference duration is an average duration of cells subjected to previous preset number of times of compensation charging processes, the cells subjected to the compensation charging processes are normal cells, and the compensation charging processes are compensation charging processes in the parallel connection mode of the batteries; and the charging and discharging management circuit is further configured to update the reference duration according to the compensation charging duration of the cell subjected to a current compensation charging process, in response to the difference being less than the preset third threshold.

20. The series-parallel battery system of claim 12, wherein the discharging demand type comprises: parallel output discharging, multi-path independent output discharging and series output discharging; and/or the charging demand type comprises: parallel charging and series charging.

\* \* \* \* \*